United States Patent [19]
Mohammad et al.

[11] Patent Number: 5,323,020
[45] Date of Patent: Jun. 21, 1994

[54] HIGH PERFORMANCE MESFET WITH MULTIPLE QUANTUM WELLS

[75] Inventors: S. Noor Mohammad, Hopewell Junction; Robert B. Renbeck, Staatsburg, both of N.Y.

[73] Assignee: International Business Machines Corporation, Armonk, N.Y.

[21] Appl. No.: 995,459

[22] Filed: Dec. 22, 1992

[51] Int. Cl.$^5$ .............. H01L 27/12; H01L 29/161; H01L 45/00
[52] U.S. Cl. ........................... 257/19; 257/20; 257/22; 257/24; 257/192; 257/285
[58] Field of Search ............ 257/15, 18, 19, 20, 257/22, 23, 24, 25, 192, 279, 281, 285

[56] References Cited

U.S. PATENT DOCUMENTS

| | | | |
|---|---|---|---|
| 4,163,237 | 7/1979 | Dingle et al. | 257/20 |
| 4,673,959 | 6/1987 | Shiraki et al. | 257/20 |
| 4,879,256 | 11/1989 | Bean et al. | 257/19 |

OTHER PUBLICATIONS

P. C. Chao, et al., "Experimental Comparisons in the Electrical Performance of Long and Ultrashort Gate Length GaAs MESFET's" IEEE Electron Device Letters, vol. EDL-3, No. 8, pp. 187-283, Aug. 1982.
P. C. Chao, et al., "Channel-Length Effects in Quarter-Micrometer Gate-Length GaAs MESFET's" IEEE Electron Device Letters, vol. EDL-4, No. 9, pp. 326-328, Sep. 1983.
A. F. Evason, et al., "Fabrication and Performance of GaAs MESFET's With Graded Channel Doping Using Focused Ion-Beam Implantation" IEEE Electron Device Letters, vol. 9, No. 6, pp. 281-283, Jun. 1988.

*Primary Examiner*—Ngan Ngo
*Attorney, Agent, or Firm*—Charles W. Peterson, Jr.

[57] ABSTRACT

A superheterojunction Field Effect Transistor (FET) with a multi-region channel on a Silicon (Si) substrate. The FET is a Metal Semiconductor FET (MESFET) or, alternatively, a Junction FET (JFET). The multi-region channel has: A first region of Si extending from the FET's source to a point under the FET's gate, beyond the gate's midpoint; a second region extending from the first region to the FET's drain, comprised of a superlattice of alternating Si and SiGe layers; and, a third region of Si extending under the first two regions from the source to the drain. The first region has a laterally graded dopant that creates an accelerating electric field. The superlattice structure increases electron mobility and transit velocity.

17 Claims, 7 Drawing Sheets

HIGH PERFORMANCE MESFET WITH MULTIPLE QUANTUM WELLS

FIELD OF INVENTION

The present invention relates generally to a semiconductor device, and in particular to high performance Junction Field Effect Transistors (JFETs) and Metal Semiconductor Field Effect Transistors (MESFETs).

BACKGROUND OF THE INVENTION

Junction Field Effect Transistors (JFETs) and Metal Semiconductor Field Effect Transistors (MESFETs) are known in the art. JFETs and MESFETs are useful for high-speed applications, in low-power integrated circuits and in super computers. Very Large Scale Integrated (VLSI) MESFET circuits are used in information processing systems such as telecommunications systems, telemetry systems, and the like.

Figure 1A:
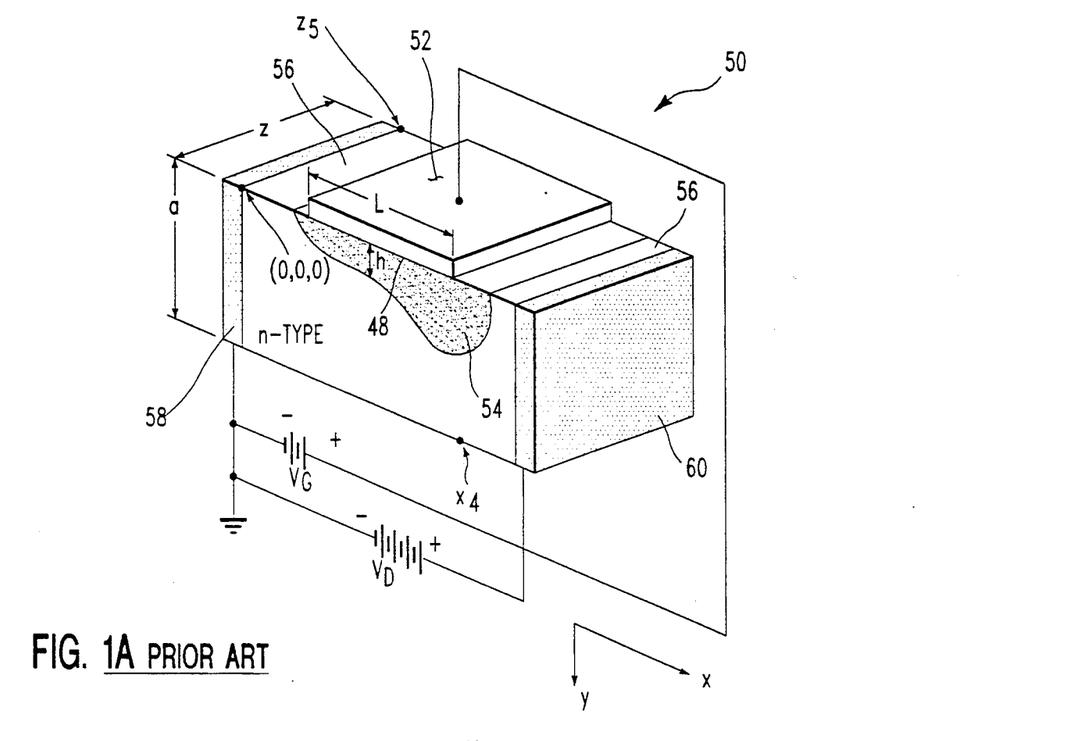
FIG. 1A-B illustrates a three-dimensional structure of the prior art of a MESFET.
Figure 1B:
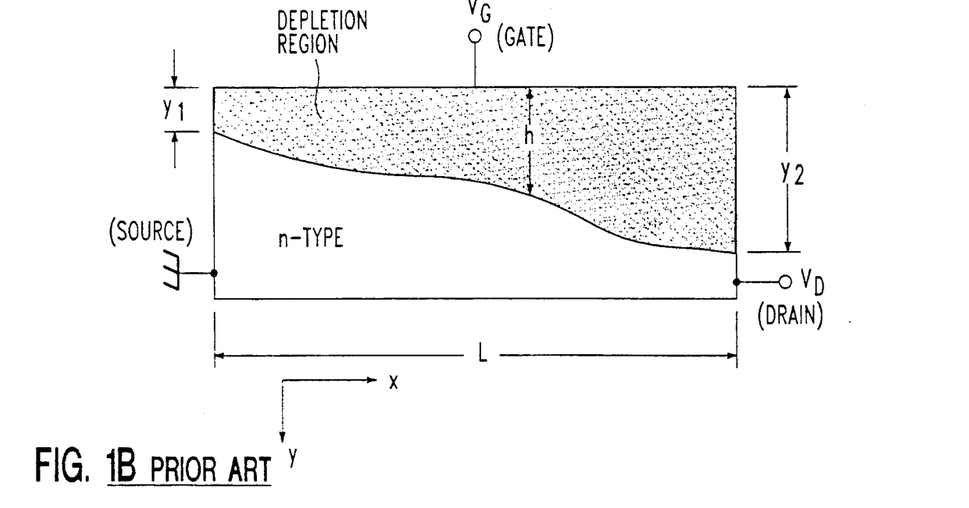

Typically, N channel prior art JFETs made from Silicon (Si) or Gallium Arsenide (GaAs) have: N+ source and drain regions; a PN semiconductor junction gate; a uniformly doped N type channel between the source and the drain regions; and a uniformly doped P type reversed biased substrate or a semi-insulating substrate. Prior art N channel MESFETs have identical regions, but a Schottky diode gate. FIG. 1A shows a representative three-dimensional cross sectional view of a prior art MESFET 50. The channel is normally off, preventing current flow. When a bias is applied to the gate 52, a depletion layer 54, which controls current flow, is modulated in the intrinsic channel (directly under the gate). Extrinsic channel 56, which separates the intrinsic channel from the device's source 58 and drain 60 is a source of channel resistance. MESFETs and JFETs require an extrinsic channel 56 to prevent drain 60 to gate 52 punchthrough and, to a lesser extent to prevent source 58 to gate 52 punchthrough. MESFET drive capability, output power, switching speed and gain are directly affected by both extrinsic and intrinsic channel resistance.

Since, when the intrinsic channel resistance is large enough, extrinsic channel resistance may be ignored, the traditional approach to improving integrated circuit performance, called "scaling," was to shrink intrinsic transistor and circuit features. Scaling reduces circuit loads and, for JFETs and MESFETs, device capacitances and channel lengths. For prior art MESFETs and JFETs, this scaling led to first order performance improvements.

However, while scaling provided performance improvements initially, eventually, the devices shrunk to the point that intrinsic channel delay was not the dominating performance parameter. Then, extrinsic channel resistance and carrier transit time (between device contacts), which had been overshadowed by intrinsic channel delays, became pronounced and limited performance improvement.

Besides channel resistance, MESFET performance is a function of the MESFET's threshold voltage ($V_t$), and device capacitances. $V_t$ is determined by:

$$V_t = V_{bi} - V_p,$$

where $V_{bi}$ is the built-in potential of the metal-semiconductor junction, and $V_p$ is the pinchoff voltage defined by:

$$V_p = (q/\epsilon) \int_0^y y N_d dy$$

where q is the electronic charge, and $\epsilon$ is the dielectric constant. As the doping density $N_d$, averaged over the entire area of the channel, is low, $V_p$ will be small, making $V_t$ less negative, needed for a good device. The junction capacitance ($C_j$) is also low.

These and other disadvantages of prior art MESFETs are disclosed in detail in Chao et al., "Experimental Comparison in The Electrical Performance of Long and Ultrashort Gate-Length GaAs MESFETs," IEEE Electron Devices Letters, vol. EDL-3, pp. 187–190 (1982) and, in Chao et al., "Channel Length Effects in quarter-micrometer Gate-Length GaAs MESFETs," IEEE Electron Devices Letters, vol. EDL-4, pp. 326–328 (1982). Other disadvantages disclosed include short channel effect problems encountered in prior art MESFETs, such as, a less positive $V_t$, a decrease of transconductance, and failure to reach saturation. For example, the high E field of a short channel device increases electron channel velocity in an N channel MESFET. However, without a sufficient reduction in extrinsic channel delay, an improvement in channel velocity is lost.

One prior art approach to reducing the short-channel effects is to increase the impurity (dopant) concentration in the channel. Most prior art Si or GaAs FETs have a uniform, lateral doping concentration, i.e., in the x and z direction. However, the dopant level $N_d$ has a Gaussian distribution as a function of depth (in the y direction). These prior art devices have a high transconductance near pinchoff, and have less device related noise. In one prior art variation, the channel doping has a single discontinuity at some point in the channel, but the dopant level still varies with depth on each side of the discontinuity. Increasing channel dopant decreases free carrier mobility and device pinchoff voltage ($V_p$). Further increasing dopant concentration enhances leakage current and impairs device transconductance.

Another problem with prior art MESFETs occurs when a voltage $V_D$ is applied to the MESFET's drain. The channel voltage drop increases in the direction of the channel (x), from the source 58 (0V) to $V_D$ at the drain 60. Consequently, the gate contact 62 is increasingly reverse biased from the source to the drain and, the width of the depletion 54, also, increases in the same direction. The depletion region 54 is widest at the drain end of the intrinsic channel, $x = x_4$. The depletion region 54 acts as an insulating region, constricting the channel opening for electron flow. This constriction is more severe for Si, which has lower mobility than GaAs mobility. Increasing channel doping to reduce this constriction decreases mobility, decreasing device transconductance and, the depletion region 54 decreases, increasing gate capacitance. Thus both DC and AC gain are reduced.

Typically, a broad-beam ion implantation technique is used to control the active channel doping in MESFET devices. Higher dose implants form source and drain regions with some separation from the gate. Broad beam ion implantation provides a dopant density $N_d(y)$ defined by:

$$N_d(y) = N_{do} \exp(-Y^2),$$

where:
$Y = (y - y_n)/y_b;$ $N_{do}$ is the peak of a doping profile;
$y_n$ is the distance of the peak from the top surface;
$y_b = \infty 2\sigma_n$;
$\sigma_n$ is the standard deviation (the straggle) of the implanted impurities; and
y is the depth of the doping profile below the metal/-silicon interface at the gate.

As the resulting dopant density does not vary in the x-direction, a non-uniform channel doping requires additional lithography and masking steps, increasing complexity and defects. These extra masking steps can be avoided by using a focussed ion beam technology as disclosed in Evanson et al., "Fabrication and performance of GaAs MESFETs with graded channel doping using focussed ion-beam implantation," IEEE Electron Devices Lett, vol. EDL-9pp. 281-283 (1988).

PURPOSES OF THE INVENTION

It is a purpose of this invention to improve short channel MESFET characteristics.

It is still another purpose of this invention to increase short channel MESFET power output.

It is still another purpose of this invention to increase short channel MESFET transconductance.

It is still another purpose of this invention to reduce short channel MESFET channel transit time.

It is still another purpose of this invention to increase short channel MESFET power output, current gain and transconductance, while reducing channel transit time.

SUMMARY OF THE INVENTION

The preferred embodiment of the present invention is a superlattice heterojunction Field Effect Transistor (FET) that may be a Metal Semiconductor FET (MESFET), or, alternatively, a Junction FET (JFET) with a multi-region channel on a semi-insulating substrate. The multi-region channel has: A first region of Si that extends from the FET's source to a point under the FET's gate, beyond the gate's midpoint; a second region extending from the first region to the FET's drain, comprised of a superlattice of alternating Si and SiGe; and, a semi-insulating region of semi-insulating material extending under the first two regions from the source to the drain.

BRIEF DESCRIPTION OF THE DRAWINGS

While the specification discloses the preferred embodiment of the present invention, its features and its advantages can be better understood when read with the following drawings.

DETAILED DESCRIPTION OF THE PREFERRED EMBODIMENT

Figure 2:
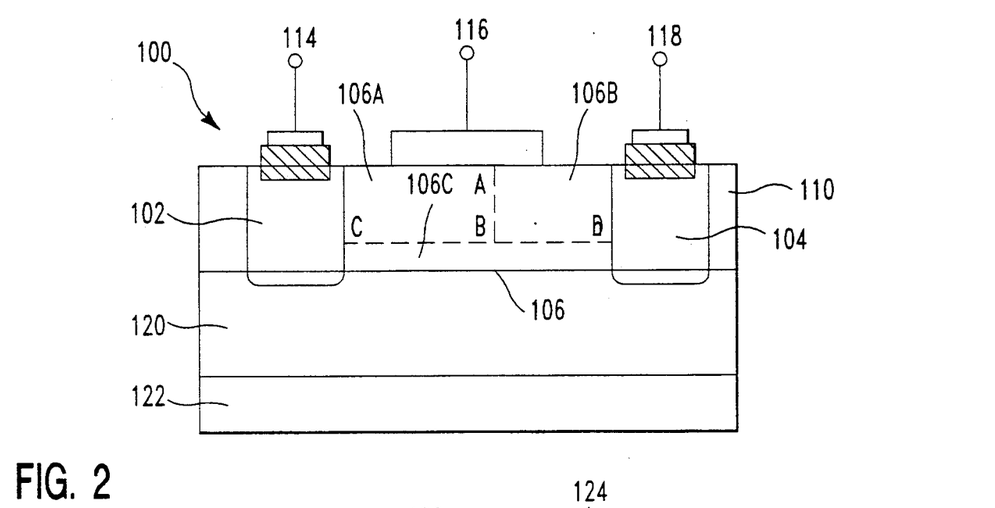
FIG. 2 illustrates cross-sectional view of a MESFET according to a preferred embodiment of the present invention.

FIG. 2 illustrates the cross-sectional representation of a MESFET according to a preferred embodiment of the present invention. While the present invention is described in terms of a MESFET, it is contemplated that disclosed device structure and process can be applied to JFETs. The MESFET 100 has an N++ source region 102 and an N++ drain region 104. Both regions 102, 104 are formed by ion implanting N type dopant into a first semiconductor layer 110. An N type multi-region channel 106 is between the source region 102 and the drain region 104. The channel 106 has three regions: First 106A on the left side of dotted line AB and above dotted line CD; Second 106B is on the right side of dotted line AB, and above dotted line CD; and third 106C below dotted line CD. Thus, the first region 106A is of a first semiconductor material (Si) and extends from the source 102 to dotted line AB, and preferably, includes the larger part of the channel 106 under the gate 108. This region 106A is preferably, non-uniformly doped in two dimensions, with N type dopant. The second region 106B is adjacent to the first region 106A at dotted line AB and lies between 106A and the drain region 104. This second channel region 106B is, preferably, smaller than first channel region 106A, and is a superlattice of quantum wells of Si and a second semiconductor material, Si$_{1-x}$Ge$_x$ (where x is the Germanium mole fraction in SiGe). The third region 106C is a semi-insulating layer, which preferably may be of sapphire or, alternatively, of SiO$_2$ or very lightly doped N-type Si (hereinafter i-type region). Each of the source region 102, gate 108, and the drain region 104, have an electrical contact 114, 116, and 118, respectively.

Figure 3A:
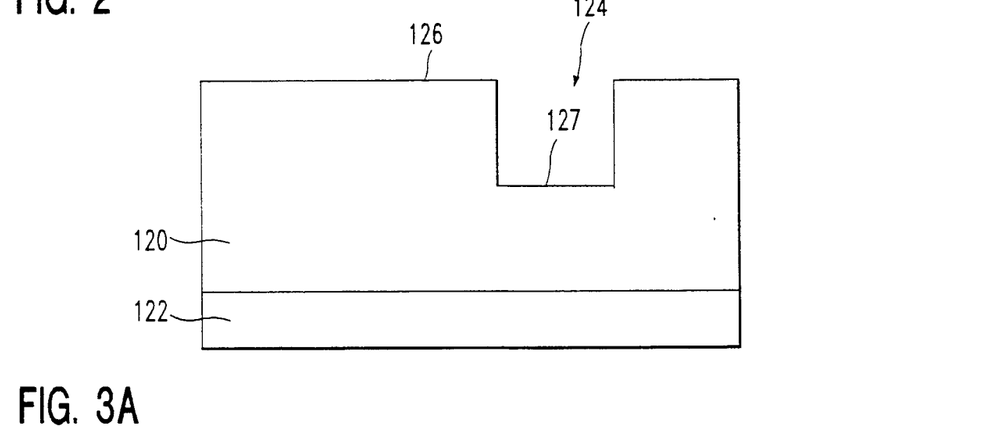
FIG. 3A-B represent steps of fabricating a MESFET according to a first preferred embodiment of the present invention.
Figure 3B:
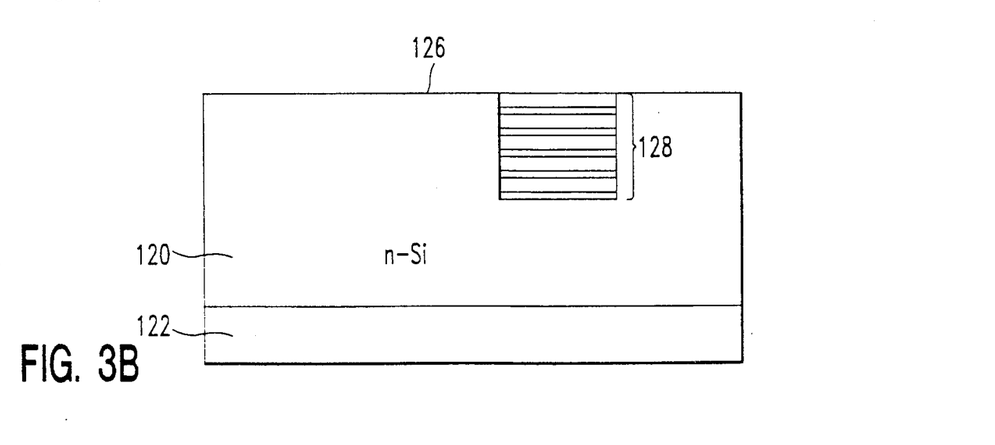

FIG. 3A-B show the processing steps of a first preferred embodiment of the present invention. An N-type silicon layer 120 is grown on a P silicon substrate 122 either by a Molecular Beam Epitaxy (MBE) method or by a Metal Organic Chemical Vapor Deposition (MOCVD) method. The substrate 122 has high resistivity to minimize parasitic substrate effects. N type silicon layer 120 is between 0.2 and 0.6 $\mu$m, with a doping density between $1*10^{16}$ and $5*10^{16}$ cm$^{-3}$.

Next, a trench 124 is formed in the surface 126 of the N silicon layer. The surface 126 is anisotropically etched using a mixture of CF$_4$+O$_2$ and RIE process. A thin thermal oxide is formed on surface 126 and selectively wet etched from the trench with BHF or, alternatively, HF, leaving the trench surfaces relatively clean and the bottom trench surface 127 is uniform (preferably planar). If the semi-insulating region 106A is other than i-type Si, the trench is etched through the silicon layer 120. The trench 124 is etched to the device's channel depth. For a short-channel MESFET with a submicron channel length (e.g., 0.1 to 0.6 $\mu$m), the desired trench depth is between 0.1 and 0.3 $\mu$m. The trench width is kept small for the construction of a short-channel MESFET. A superlattice region 128 in FIG. 3B is grown in the trench 124 to form 106B.

Figure 4:
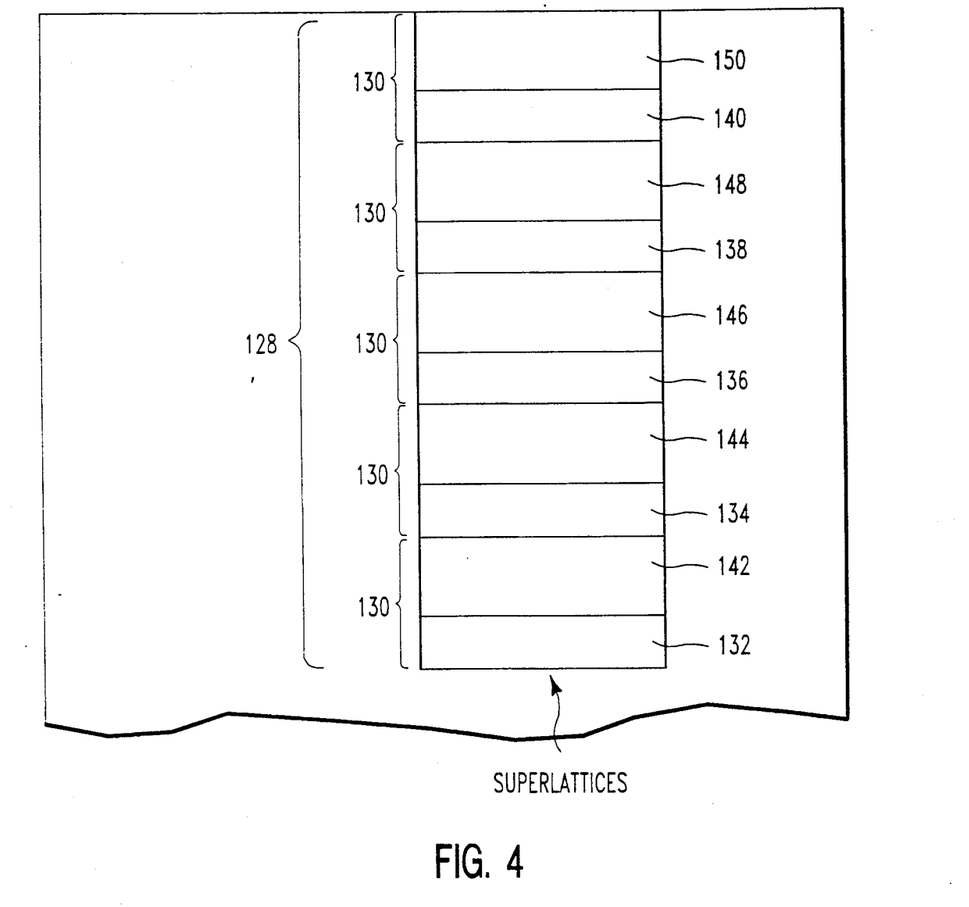
FIG. 4 illustrates an elevated view of a superlattice grown for a MESFET according to the first preferred embodiment of the present invention.
Figure 5:
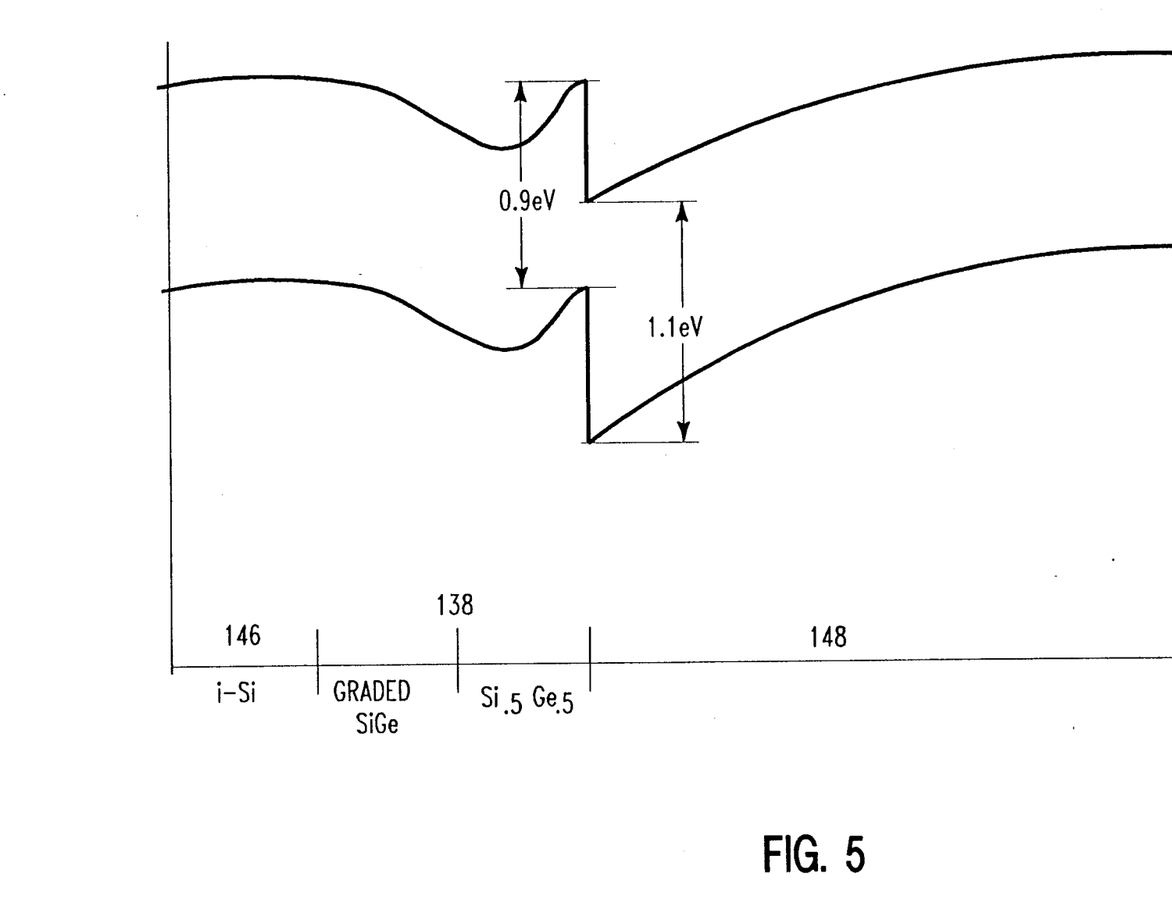
FIG. 5 is a band diagram of a Si/Si$_{1-x}$Ge$_x$ heterostructure of a superlattice grown according to the first preferred embodiment of the present invention.

FIG. 4 is a representation of the superlattice structure 128 of channel region 106B, wherein five superlattice periods of Si/Si$_{1-x}$G$_x$ 130 are selectively grown in the trench 124 to result in a 1$\mu$ device. Fewer periods may be used for shorter channel devices. In the preferred embodiment, the layers are grown at an epitaxy temperature of about 600° C. on the {100}-plane of the N silicon. The layer sequence of the superlattice 128 is alternating $Si_{1-x}Ge_x$ layers, 132, 134, 136, 138, 140 each about 200 Å thick, and undoped (intrinsic) silicon layers 142, 144, 146, 148, 150 each between 300 and 1000 Å thick. First, $Si_{1-x}Ge_x$ layer 132 is grown on N silicon 120. Then, undoped silicon layer 142 is grown on $Si_{1-x}Ge_x$ layer 132. FIG. 5 is the energy band diagram of a $Si/Si_{1-x}Ge_x$ heterostructure layer 130. A 2-Dimensional Electron Gas (2-DEG) is formed in the undoped silicon side of the hetero-interface of the doped $Si_{1-x}Ge_x$ 152 and undoped silicon 154. Each of $Si_{1-x}Ge_x$ layers 132, 134, 136, 138 and 140 has two sub layers. A first sub layer of $Si_{0.5}Ge_{0.5}$ and a second sub layer wherein x is graded from 0.0 at the Si/SiGe interface to 0.5. Two-dimensional quantum wells are formed by the heterojunctions at each interface, 132-142, 134-144, 136-146, 138-148, and 140-150.

The Germanium mole fraction in $Si_{1-x}Ge_x$ directly influences the height of the quantum wells. In the preferred embodiment, the mole fraction of Ge is preferably 0.5 in the doped sub-layers of the $Si_{1-x}Ge_x$ and, is chosen to maximize the depth of the quantum well without causing structural dislocation of the superlattice layers. However, a smaller mole fraction, x, of $Si_{1-x}Ge_x$ may be substituted to increase the layers' defect-free thickness.

Figure 6:
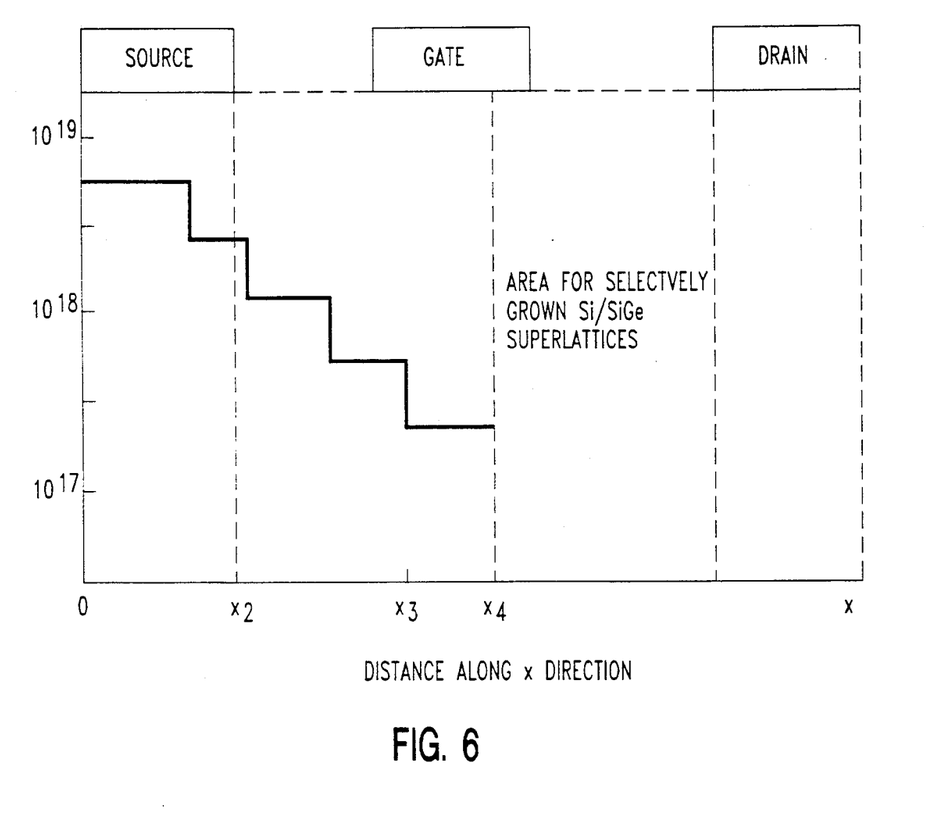
FIG. 6 illustrates a lateral variation of the doping density according to the present invention.

Preferred embodiment devices have improved electrical performance because they have a high doping density in the channel area 106A and a lower doping density in channel area 106B. Although it is contemplated that the doping in each superlattice layer is uniform, the source region 102 and the channel region 106A of preferred embodiment devices are non-uniformly doped with a focussed ion beam implantation technique. The implant dose is controlled such that besides varying in the y direction as in prior art devices, the doping profile is stepwise varying, with at least 1 step and preferably 5 discrete steps in the x-direction from the source 102, through channel region 106A to the edge of channel region 106B as shown in FIG. 6. Thus, in the preferred embodiment of the present invention, $N_{do}$ is no longer a constant (horizontally), but a function of x. Consequently, the doping density for the preferred embodiment device, $N_d(x,y)$ is defined by:

$$N_d(x,y) = N_{do}(x)\exp(-Y_2)$$

Therefore, for the preferred embodiment device, channel doping varies in Gaussian fashion with y at each value of x. However, for a given value of y (or integrated over y), the channel doping has the form of a staircase extending from a maximum of $5-7*10^{18}$ between the source at $x=0$ and $x=x_2$ to a minimum of $2-5*10^{17}$ near the edge of the superlattice, between $x=x_3$ and $x=x_4$. Ion implantation is followed by rapid thermal annealing and contact sintering.

Thus, with the structure of the preferred embodiment, multiple masking steps during fabrication are avoided. The dopant concentration precisely varies with position and magnitude in a single mask step. The preferred embodiment device's vertical and lateral doping profiles are simultaneously varied in a single mask step.

Once the source, channel, and the drain regions have been doped, ohmic contacts are formed by a conventional method for source, gate and drain contacts. In one embodiment, ohmic contacts are formed by thermal evaporation of 0.3 μm AuSb with the excess material lifted off of the area surrounding the contacts. To maintain a low dopant level under the gate contact, precautions must be taken to avoid altering the channel dopant density during gate contact metal deposition. Also, the gate electrode contacting the topmost layer of the $Si/Si_{1-x}Ge_x$ superlattice 150, undoped or lightly doped silicon, should not alter that layer's dopant level. This top Superlattice layer 150 in contact with the metal forms a Schottky barrier. The structure is annealed at 330° C. under protective gas for 30 seconds.

The multiple quantum wells of the preferred embodiment device create potential notches at the $Si/Si_{1-x}Ge_x$ interfaces. These potential notches, which contain 2-DEG, extend through the heterostructure region and, therefore, behave as low-resistive paths to the drain. Electrons moving through these notches have a higher mobility because scattering is minimized. This higher mobility reduces carrier transit time and delay occurring through 106B, further improving device performance.

In the preferred embodiment of the present invention the dopant level in channel region 106A is higher than the dopant level in channel regions 106B and 106C. Because the dopant density in channel region 106A is not uniform, but lower near the gate, the gate to source capacitance is reduced. However, gate to source breakdown voltage is still high enough for effective device operation. In the superlattices of region 106B, the highly doped $Si_{1-x}Ge_x$ layers 132-140 are much thinner than the undoped silicon layers 142-150 to minimize lattice mismatch structural dislocations. Consequently, superlattice quantum wells can be formed for the preferred embodiment device, the extrinsic channel resistance at the drain is significantly reduced over prior art MESFETs and JFETs and device transconductance is increased without a corresponding decrease in gain or output power.

In summary, the average channel dopant density $N_d$ is reduced over prior art devices and junction capacitance is low. Further, the preferred embodiment device with two-dimensional graded doping has: $N_{do}$ higher (about $5-8*10^{18}$ cm$^{-3}$) at the source, decreasing in a stepwise fashion to $3-5*10^{17}$ cm$^{-3}$ at the superlattice edge (see FIG. 6); and, a built-in electrostatic field that accelerates electrons from the source region to the active channel region under the gate, effectively providing increased electron mobility. Thus, carrier transit time is improved with a corresponding device performance. Furthermore, the introduction of a semi-insulating or a lightly doped i-layer between the channel and the substrate significantly reduces the MESFET's gate-substrate junction capacitance. The MESFET of the preferred embodiment has an increased frequency response, both because of improved channel transit time and because of reduced device capacitance.

In a second preferred embodiment of the present invention the hetero-structure is formed by growing superlattice layers, which are sub-etched, and then, using a low temperature lateral overgrowth technique, the sub-etched areas are filled with silicon. Such a technique is disclosed in Burghartz et al., "Self-aligned bipolar epitaxial base n-p-n transistors by selective epitaxy emitter window (SEEW) technology," IEEE Trans. Electron Devices, vol. ED-38, pp. 378-385 (1991).

Figure 7A:
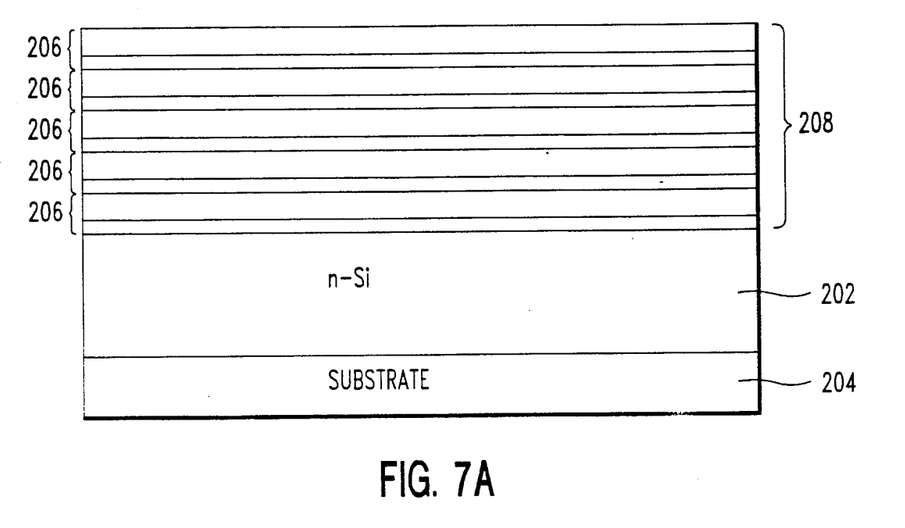
FIG. 7A-D illustrate a layer structure grown according to a second preferred embodiment of the present invention.

FIG. 7A-D illustrate the processing steps of this second preferred embodiment $Si/Si_{1-x}Ge_x$ superlattice N channel MESFET. In FIG. 7A, an N type silicon layer 202 is MBE or MOCVD grown on a semi-insulating substrate 204. The substrate 204 and the N type silicon layer 202 are identical with the substrate 122 and N type silicon layer 120 of FIG. 3A. Five superlattice 208 periods 206 of $Si/Si_{1-x}Ge_x$ are grown on N type silicon layer 202. Each superlattice period 206, has an undoped silicon layer 210, 212, 214, 216 and 218 grown on a $Si_{1-x}Ge_x$ layer 220, 222, 224, 226, and 228 respectively. The thicknesses and doping characteristics of the layers 210-218 and 220-228 are identical with those of the layers 142-150 and 132-140 respectively.

Figure 7B:
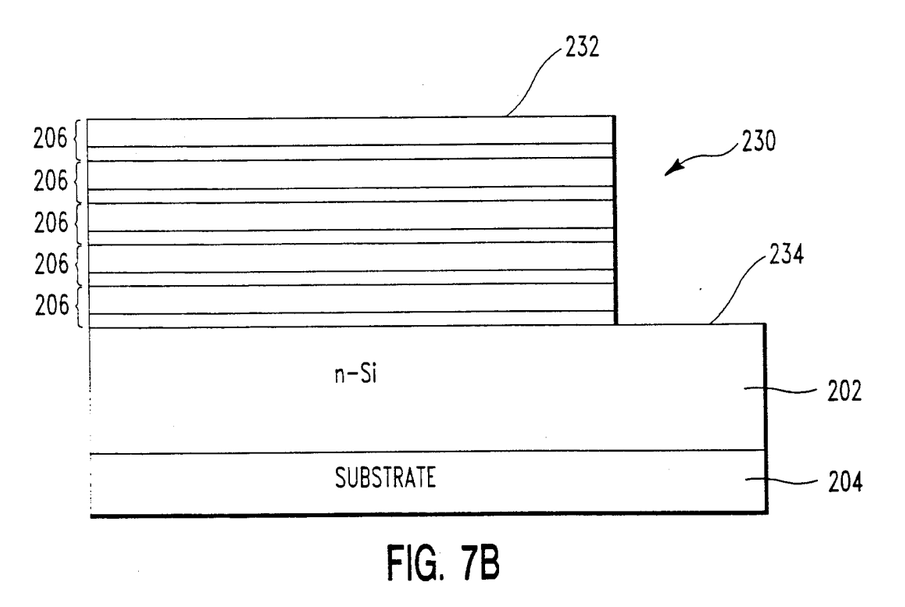
Figure 7C:
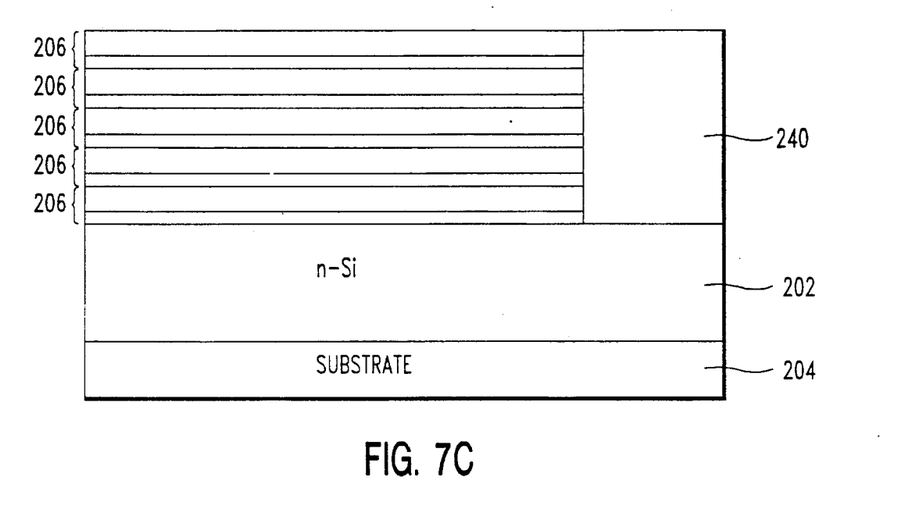
Figure 7D:
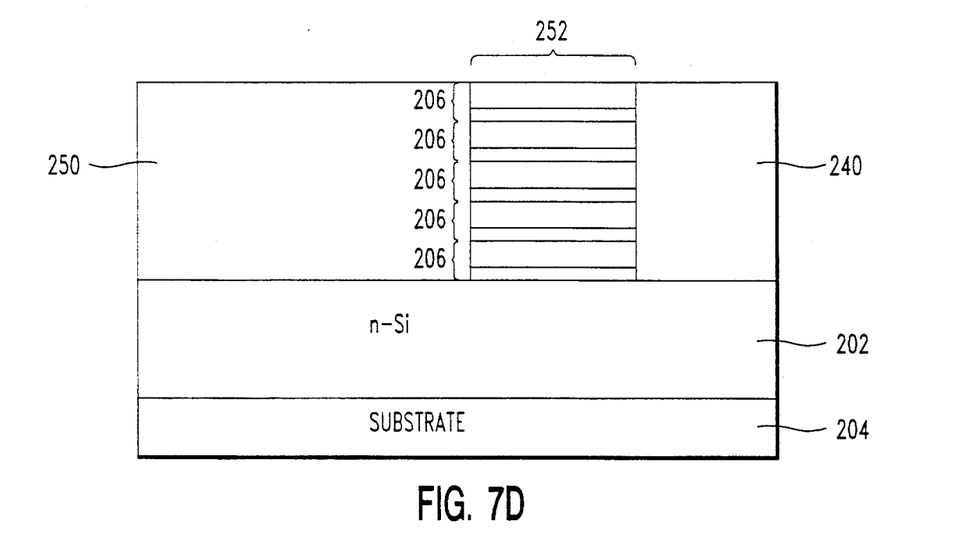

After growing the superlattice 208, the device's source-channel (S-C) and drain regions are defined. The drain region is defined when a first portion, 230 in FIG. 7B, is dry etched from the superlattice 208, using a chlorine based etchant on the Si layers to minimize thermal exposure of $Si_{1-x}Ge_x$, and, using an $SF_6$ and $CF_3Br$ plasma for the $Si_{1-x}Ge_x$ layer. Next, in FIG. 7C, the etched area is filled with N silicon such that the top surface of the N silicon 240 is co-planar with the unetched top superlattice layer. The S-C region 250 is similarly defined, as represented in FIG. 7D, by etching a second superlattice portion. The structure of this second preferred embodiment, once the S-C region has been defined, is identical with the structure of the first preferred embodiment in FIG. 3B. Further processing of the second preferred embodiment MESFET is identical to that of the first.

Although the above description of the preferred embodiments of the present invention describes specific device structures, a person of ordinary skill in the art would understand that in all pertinent regions swapping P and N regions provide functionally equivalent results. Further, numerous modifications and variations will occur to a person of ordinary skill in the art without departing from the spirit and scope of the invention.

We claim:

1. A Field Effect Transistor (RET) with a gate, a drain, a source and further comprising:
   a semi-insulating substrate; and
   a multi-region channel comprising:
   a first region of a first semiconductor material, said first region extending towards said drain from said source to a point under said gate beyond the midpoint of said gate,
   a second region comprised of a superlattice of quantum wells, said second region extending from said first region to said drain, and,
   a semi-insulating region on said semi-insulating substrate extending from said source to said drain under said first region and said second region.

2. The FET of claim 1 wherein the superlattice comprises alternating layers of said first semiconductor material and a second semiconductor material.

3. The FET of claim 1 wherein said first semiconductor material is N+ silicon.

4. The FET of claim 2 wherein said first semiconductor material is silicon and said second semiconductor material is SiGe.

5. The FET of claim 4 wherein said silicon layers are between 300 Å and 1000 Å thick and said SiGe layers are 200 Å thick.

6. The FET of claim 4 wherein the silicon layers are N+ doped to a dopant density between $10^{16}$ cm$^{-3}$ and $5*10^{16}$ cm$^{-3}$.

7. The FET of claim 4 wherein the mole fraction of Germanium in SiGe≦0.5.

8. The FET of claim 7 wherein the mole fraction of Germanium=0.5.

9. The FET of claim 1 wherein said multi-region channel has a laterally varying dopant density.

10. The FET of claim 1 wherein said first region has a laterally varying dopant density.

11. The FET of claim 10 wherein said laterally varying dopant density is a plurality of discrete dopant densities, whereby each of said dopant densities are in a portion of said first region.

12. The FET of claim 11 wherein said plurality of discrete dopant densities are distributed such that a maximum density is at said source, a minimum density is at the opposite end of said first region and the dopant densities uniformly decrease from said maximum to said minimum.

13. The FET of claim 1 wherein said gate is metal and said FET is a MESFET.

14. The FET of claim 1 wherein said gate is doped semiconductor and said FET is a JFET.

15. The FET of claim 1 wherein said semi-insulating region is a region of i-type silicon.

16. The FET of claim 1 wherein said semi-insulating region is an insulating region of sapphire.

17. The FET of claim 1 wherein said semi-insulating region is an insulating region of $SiO_2$.

* * * * *

UNITED STATES PATENT AND TRADEMARK OFFICE
CERTIFICATE OF CORRECTION

PATENT NO.  : 5,323,020
DATED       : June 21, 1994
INVENTOR(S) : S. Noor Mohammad and Robert B. Renbeck It is certified that error appears in the above-indentified patent and that said Letters Patent is hereby corrected as shown below:

Column 3, line 3, after "yb ="

please delete " $\infty 2\sigma_n;$ "    and insert instead

-- $\sqrt{2\sigma_n};$ --

IN THE CLAIMS:

Column 7, Claims 1, line 1,
    please delete "(RET)" and insert instead --(FET)--.

Column 8, Claim 8, line 2, after "Germanium"
    please insert -- SiGe --.

Signed and Sealed this

Tenth Day of June, 1997

Attest:

BRUCE LEHMAN

Attesting Officer

Commissioner of Patents and Trademarks